United States Patent [19]

Kurokawa

[11] Patent Number: 4,608,063
[45] Date of Patent: Aug. 26, 1986

[54] EXHAUST SYSTEM FOR CHEMICAL VAPOR DEPOSITION APPARATUS

[75] Inventor: Takashi Kurokawa, Yokohama, Japan

[73] Assignee: Canon Kabushiki Kaisha, Tokyo, Japan

[21] Appl. No.: 669,527

[22] Filed: Nov. 8, 1984

[30] Foreign Application Priority Data

Nov. 25, 1983 [JP] Japan .................. 58-220779

[51] Int. Cl.4 ............................................. B01D 35/18
[52] U.S. Cl. .................................... 55/208; 55/267; 55/282; 118/50.1; 427/38
[58] Field of Search ............... 55/208, 267, 282; 118/50.1, 603, 610; 427/38, 294, 295, 345, 350

[56] References Cited

U.S. PATENT DOCUMENTS

| | | | |
|---|---|---|---|
| 1,679,090 | 7/1928 | Lammert | 55/267 X |
| 2,334,971 | 11/1943 | Walker | 55/282 X |
| 2,415,621 | 2/1947 | Arnhym | 55/267 |
| 3,224,169 | 12/1965 | Gaylord, Jr. | 55/208 |
| 3,469,375 | 9/1969 | Barrington et al. | 55/208 |
| 3,950,152 | 4/1976 | Guon | 55/267 X |
| 4,347,065 | 8/1982 | Gans | 55/267 X |
| 4,485,622 | 12/1984 | Takagi | 55/282 X |
| 4,501,766 | 2/1985 | Suzuki et al. | 118/50.1 X |

FOREIGN PATENT DOCUMENTS

| | | | |
|---|---|---|---|
| 2523469 | 9/1983 | France | 55/267 |
| 13172 | 2/1977 | Japan | 55/267 |

Primary Examiner—Robert Spitzer
Attorney, Agent, or Firm—Fitzpatrick, Cella, Harper & Scinto

[57] ABSTRACT

An exhaust system comprising an exhaust device and a collecting device incorporating a filter and positioned in front of the exhaust device, the exhaust system being adapted for use in a chemical vapor deposition apparatus, wherein at least a part of the collecting device is heated.

1 Claim, 1 Drawing Figure

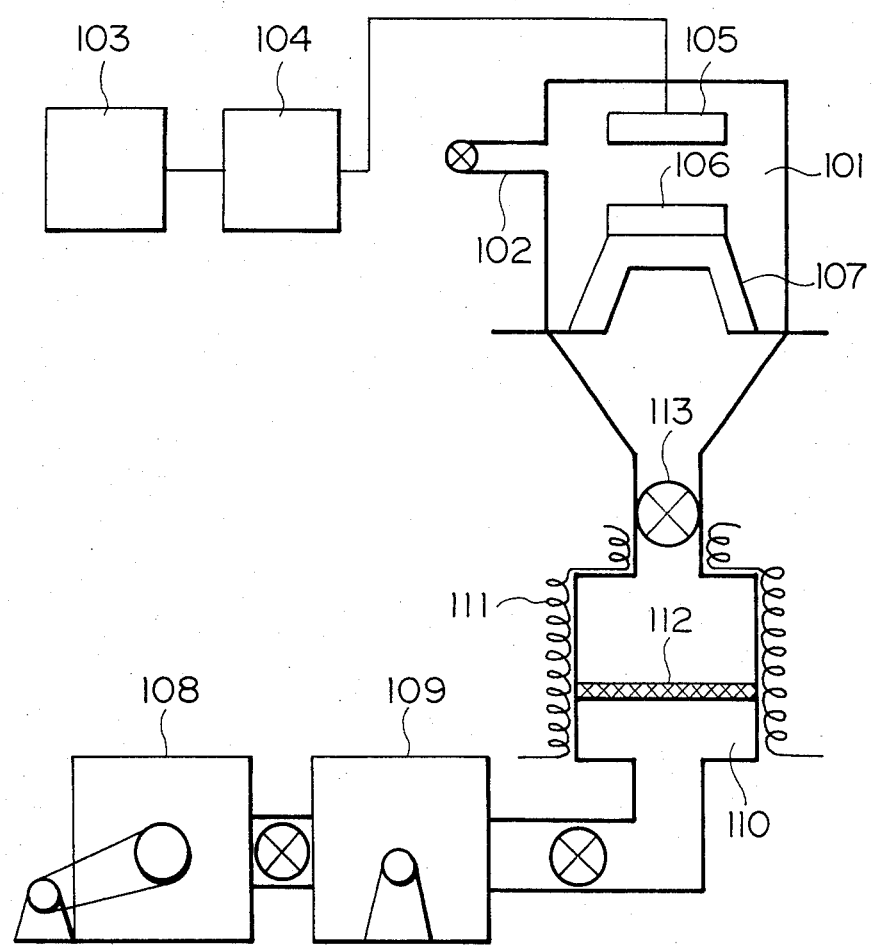
F I G. 1

EXHAUST SYSTEM FOR CHEMICAL VAPOR DEPOSITION APPARATUS

BACKGROUND OF THE INVENTION

1. Field of the Invention

The present invention relates to collecting means for powder by-products generated in a decomposition process of a raw material gas in a chemical vapor deposition apparatus.

2. Description of the Prior Art

The chemical vapor deposition (CVD) process has recently been attracting attention as a forming method for the insulating layer for integrated circuits, solar cells and electrophotographic photosensitive members, in view of the usefulness of the process at a relatively low temperature, and of the superiority of the properties of the obtained layer, and has already been partly employed in commercial production in those fields.

The CVD process is generally performed by introducing gaseous raw material molecules into a deposition chamber in which pressure can be reduced by an exhaust system and decomposing the raw material gas with an excitation energy to deposit a desired layer on a desired substrate. In such process, the function of said exhaust system is often hindered by by-products of powder form (hereinafter called fine powder) which are generated in the course of deposition of the raw material gas. As an example, in the formation of a layer of silicon hydride-nitride, silicon hydride-nitride-oxide, silicon hydride-oxide, silicon hydride or silicon-germanium hydride, fine powder containing silicon is generated as a by-product and deposited in the exhaust system, significantly degrading the exhaust ability. It therefore becomes not only difficult to maintain a constant gas pressure in the deposition chamber over a prolonged period but also difficult to obtain a layer having desired properties since the gas pressure in the deposition chamber gradually rises even in a single operation whereby the raw material gas concentration and the discharge between the electrodes become unstable.

The conventional CVD apparatus is generally equipped with a filter in front of the exhaust system in order to eliminate such fine powder generated in the layer deposition, but said fine powder, being soft at a low temperature and easily clogging such filter, not only deteriorates the productivity significantly but also undesirably affects the properties of the deposited layer.

SUMMARY OF THE INVENTION

In consideration of the foregoing, the object of the present invention is to provide a process for collecting the fine powder generated in the formation of a deposition layer through the CVD process, said process being free from the drawbacks of the abovedescribed conventional processes for fine powder collection.

The aforementioned object can be achieved according to the present invention, in an exhaust system for a CVD apparatus composed of an exhaust device and a collecting device equipped with a filter and positioned in front of said exhaust device, by heating said collecting device, or heating said collecting device and exhaust pipings to said collecting device.

BRIEF DESCRIPTION OF THE DRAWING

FIG. 1 is a schematic cross-sectional view of a plasma CVD apparatus, as an example of the CVD apparatus, provided with an exhaust system according to the present invention.

DETAILED DESCRIPTION OF THE PREFERRED EMBODIMENT

The present invention will now be clarified in detail by an embodiment shown in the attached drawing. FIG. 1 schematically shows a plasma CVD apparatus, as an example of the CVD apparatus, provided with an exhaust system according to the present invention. In FIG. 1, there are shown a deposition chamber 101 for forming a deposited layer, which is connected to an exhaust system through a main valve 113; a raw material gas inlet 102 for introducing the raw material gas into the deposition chamber; a substrate 106 supported by a support member 107 and functioning as a grounded anode; and a discharge power source 103 which applies, through a matching box 104, a high voltage of a desired frequency, usually 13.56 MHz, to an electrode 105, thereby decomposing the raw material gas and depositing a layer onto the substrate. The composition or structure of the raw material gas, deposition chamber, substrate, electrodes, etc., is not critical and may be arbitrarily selected for producing the desired deposited layer.

There are also shown an oil rotary pump 108 and a mechanical booster pump 109 constituting an exhaust device for reducing the pressure in the deposition chamber, generally to a vacuum of 0.5 to $1.0 \times 10^{-3}$ Torr; a fine powder collecting device 110 provided with a filter 112 and positioned in front of said exhaust device for preventing smearing of the exhaust device by the fine powder; and a heater 111 connected to an unrepresented heating power source and positioned to heat said collecting device and an exhaust piping between said collecting device and the main valve (hereinafter called front exhaust piping). The heating is conducted to a temperature to sufficiently harden the fine powder to avoid the filter clogging, namely 100° C. or higher in the collecting device and in the exhaust front piping. After said exhaust device there is generally provided, though unrepresented, a scrubber for eliminating toxic or corrosive gas employed in the reaction by means of an aqueous solution or a catalyst such as Toxoclean prior to the discharge into the air, and a nitrogen gas introducing line for diluting combustible gas such as silane to a concentration below the explosion limit.

The present invention is based on the fact that the fine powder generated in the layer deposition in the CVD process becomes harder at higher temperatures, and is therefore characterized by heating the collecting device and the exhaust front piping, and such heating facilitates the collection of the fine powder and resolves the troubles in the exhaust system such as the lowered exhaust ability of the exhaust device, thus enabling one to stably obtain a deposited layer of desired properties and to improve the productivity.

According to the present invention it is desirable to heat both the collecting device and the exhaust front piping, but it is also possible to achieve the same effects depending on the species or flow rate of the raw material gas, state of generation of the fine powder and the applied voltage.

The heating method and the heat source may be arbitrarily selected as long as the collecting device and the exhaust front piping can be sufficiently heated, and, for example, there may be employed a method of passing steam or hot air into a pipe provided in said devices, or a method of electrical heating by heaters such as nickel-chromium wires provided on said devices. Though the heating method is not limited, it is preferable to heat said devices from the outside rather than using internal heating, since combustible gases are often used in said devices.

In the present invention there may be employed any filter that is heat resistant and is capable of satisfactorily collecting granular substances contained in the exhaust gas from the reaction chamber, but a filter incorporating a mesh for example of stainless steel is preferable in consideration of the ease of maintenance. The mesh size is determined to satisfactorily collect the granular substance without affecting the exhaust capacity of the vacuum pump, and is preferably in a range from 100 to 10,000 mesh. Plural filters of the same or different mesh sizes may be employed depending on the status of generation of the fine powder. Also said filter is preferably constructed as a cassette filter for facilitating periodical discharge of the collected powder.

The exhaust device to be employed in the present invention can be of any type that can maintain a vacuum of 0.5 to $1.0 \times 10^{-3}$ Torr in the deposition chamber, and there may generally be employed an oil rotary pump, a mechanical booster pump, a turbo molecular pump, etc. Among these pumps is preferred a combination, from the side of the deposition chamber, of a mechanical booster pump and an oil rotary pump, of a turbo molecular pump and an oil rotary pump or of a turbo molecular pump and a sorption pump (for example a molecular sorption pump), and particularly preferred is the combination of a mechanical booster pump and an oil rotary pump.

The present invention will be understood further from an example.

EXAMPLE

In the plasma CVD apparatus shown in FIG. 1, the collecting device and the exhaust front piping were provided with ribbon-shaped heaters to maintain said collecting device and said piping at 250° C. There were employed two filters incorporating stainless meshes of 200 mesh size.

$SiH_4$ gas diluted with $H_2$ gas to a concentration of 10 vol.% was employed as the raw material gas and was supplied at a flow rate of 100 SCCM at a pressure of 0.3 Torr in the deposition chamber. A high frequency voltage of 13.56 MHz was applied across the electrodes to form an amorphous silicon layer on an aluminum substrate.

In the operation without heating, the pressure in the deposition chamber showed gradual increase in three batches, and troubles such as filter clogging were observed in the following batches. On the other hand, in the operation with heating, the pressure in the deposition chamber was stable even after twenty batches and the deposited layer with desired properties could be obtained in stable manner without the troubles such as filter clogging.

What I claim is:
1. A CVD apparatus comprising:
    (1) a deposition chamber in which gas introduction means and gas discharge means are provided;
    (2) a discharge electrode provided within said deposition chamber;
    (3) supporting means for supporting a substrate on which deposition layer is formed and which is arranged opposite to said electrode provided within said deposition chamber; and
    (4) a fine powder collecting chamber having a filter means for collecting a fine powder and a heater for heating said fine powder collecting chamber, mechanical booster pump means, and oil rotary pump means, said fine powder collecting chamber, said mechanical booster pump means and said oil rotary pump means being arranged in an exhaust path downstream of said gas discharge means in the order named.

* * * * *